(12) United States Patent
Mayer et al.

(10) Patent No.: US 12,745,361 B2
(45) Date of Patent: Sep. 22, 2026

(54) ELECTRICAL DEVICE, IN PARTICULAR CONVERTER OR CONVERTER MOTOR, HAVING A COVER PART AND SIGNAL ELECTRONICS

(71) Applicant: SEW-EURODRIVE GMBH & CO. KG, Bruchsal (DE)

(72) Inventors: Ralph Mayer, Ubstadt-Weiher (DE); Jan Polley, Bad Schönborn (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 751 days.

(21) Appl. No.: 17/799,452

(22) PCT Filed: Jan. 25, 2021

(86) PCT No.: PCT/EP2021/025026
§ 371 (c)(1),
(2) Date: Aug. 12, 2022

(87) PCT Pub. No.: WO2021/160339
PCT Pub. Date: Aug. 19, 2021

(65) Prior Publication Data

US 2023/0301007 A1 Sep. 21, 2023

(30) Foreign Application Priority Data

Feb. 12, 2020 (DE) ..................... 10 2020 000 909.3

(51) Int. Cl.
*H05K 7/20* (2006.01)
*H01R 12/55* (2011.01)
(Continued)

(52) U.S. Cl.
CPC ......... *H05K 7/14327* (2022.08); *H01R 12/55* (2013.01); *H01R 13/6273* (2013.01);
(Continued)

(58) Field of Classification Search
CPC . H05K 7/14327; H02K 11/35; H01R 13/6273
See application file for complete search history.

(56) References Cited

U.S. PATENT DOCUMENTS 4,963,777 A 10/1990 Blum
9,414,515 B2 8/2016 Kiesel et al.
(Continued)

FOREIGN PATENT DOCUMENTS

DE 7045223 U 3/1971
DE 3902326 A1 8/1990
(Continued)

OTHER PUBLICATIONS

DE 102010047762 english description (Year: 2012).*
(Continued)

*Primary Examiner* — Jerry Wu
(74) *Attorney, Agent, or Firm* — Carter, DeLuca & Farrell LLP

(57) ABSTRACT

In an electrical device, e.g., a converter or converter motor, having a cover part and signal electronics, the signal electronics have a first printed circuit board and a memory unit which is electrically plug connected to the first printed circuit board, e.g., by an electrical plug connection, and the memory unit has a switch unit, e.g., a selector switch and/or a DIP switch.

21 Claims, 6 Drawing Sheets

(51) Int. Cl.
*H01R 13/627* (2006.01)
*H02K 11/33* (2016.01)
*H02K 11/35* (2016.01)
*H05K 7/14* (2006.01)

(52) U.S. Cl.
CPC ............. *H02K 11/33* (2016.01); *H02K 11/35* (2016.01); *H05K 7/2039* (2013.01)

(56) References Cited

U.S. PATENT DOCUMENTS

| | | | | |
|---|---|---|---|---|
| 2004/0192099 | A1* | 9/2004 | Seminara | H01R 13/639 439/352 |
| 2009/0070575 | A1* | 3/2009 | Ehlich | G05B 19/0426 713/2 |
| 2012/0210037 | A1* | 8/2012 | Kiesel | H01R 13/405 710/305 |
| 2018/0228048 | A1* | 8/2018 | Blösch | H05K 5/0217 |
| 2020/0044402 | A1* | 2/2020 | Huang | H01R 13/6273 |
| 2022/0052587 | A1 | 2/2022 | Mayer | |

FOREIGN PATENT DOCUMENTS

| | | | | |
|---|---|---|---|---|
| DE | 4100112 | C1 | 12/1991 | |
| DE | 102005032075 | A1 | 1/2007 | |
| DE | 102007043769 | A1 | 3/2009 | |
| DE | 102007058880 | A1 | 6/2009 | |
| DE | 102009049407 | A1 | 2/2011 | |
| DE | 102009050232 | A1 | 5/2011 | |
| DE | 102010047762 | A1 * | 4/2012 | H02K 11/0094 |
| DE | 202015102458 | U1 | 5/2015 | |
| DE | 102019005793 | A1 | 3/2020 | |
| EP | 1104080 | A2 | 5/2001 | |
| EP | 3035138 | A1 | 6/2016 | |

OTHER PUBLICATIONS

International Search Report issued in corresponding International Application No. PCT/EP2021/025026 dated Apr. 22, 2021, pp. 1-2, English Translation.

International Report on Patentability issued in corresponding International Application No. PCT/EP2021/025026 dated Aug. 11, 2022, pp. 1-7, English Translation.

Chinese Office Action issued by the China National Intellectual Property Administration on Jan. 14, 2025 in corresponding CN Patent Application No. 202180010174.4, with English translation.

* cited by examiner

ELECTRICAL DEVICE, IN PARTICULAR CONVERTER OR CONVERTER MOTOR, HAVING A COVER PART AND SIGNAL ELECTRONICS

FIELD OF THE INVENTION

The present invention relates to an electrical device, e.g., a converter or converter motor, having a cover part and signal electronics.

BACKGROUND INFORMATION

In certain conventional systems, signal electronics are arrangeable in a housing.

SUMMARY

Example embodiments of the present invention make an electrical device suitable for various applications and/or repairable with little effort.

According to an example embodiment of the present invention, in a device and a method, an electrical device, e.g., a converter or converter motor, is provided with a cover part and signal electronics. The signal electronics have a first printed circuit board and a memory unit which is electrically plug-connected to the first printed circuit board, e.g., by an electrical plug connection, and the memory unit has a switch unit, e.g., a selector switch, a DIP switch, etc. For example, the signal electronics, e.g., the operating mode of the signal electronics, functions as a different AS-Interface slave profile depending on the switch position of the switch unit and/or as a different AS-Interface slave type depending on the switch position of the switch unit.

For example, the operating mode is predeterminable by the switch position of the switch unit. Therefore, two different electrical devices do not have to be produced for two different operating modes, but rather the operating mode is predeterminable by specifying the switch position. Thus, a switch unit has to be provided. However, therefore only a single variant is to be produced and two different variants do not have to be produced. In this manner, the expenditure is reduced such that the additional expenditure for the switch unit is overcompensated.

For example, the operating mode of an AS-Interface slave profile or type can be provided as the operating mode.

According to example embodiments, a wall part is connected to the cover part, and the first printed circuit board is arranged between the wall part and the cover part, e.g., the first printed circuit board is connected to the cover part. It is considered advantageous that the wall part with the cover part protects a spatial region in which the first printed circuit board is arranged. In this manner, the printed circuit board and the signal electronics components mounted on it are protected accordingly. However, the wall part can also be provided as an electrical and/or thermal insulation device. In this manner, the signal electronics are thermally separable from power electronics.

According to example embodiments, the wall part is manufactured from plastic and/or the cover part is made of metal, e.g., as a die-cast aluminum part, and, for example, the wall part functions as a heat barrier, e.g., as a heat barrier between the signal electronics and an electric motor, to the housing part of which the cover part is connected. It is considered advantageous that the cover part is connectable to a housing part of an electric motor or to a lower part which is connected to a housing part of an electric motor and in which power electronics can also be arranged. A converter motor is thus formable in which the signal electronics can be cooled via the cover part and the power electronics can be cooled via the lower part and/or the housing part. The electric motor, e.g., its stator winding, can thus be cooled together with the power electronics via the housing part and the lower part if no further heat barrier is provided between them.

According to example embodiments, the memory unit has a further printed circuit board, which is accommodated in a housing of the memory unit, and the housing has a lower part and an upper part connected to the lower part. It is considered advantageous that the further printed circuit board is arranged in a protected manner and a guided electrical plug connection of the further printed circuit board to the first printed circuit board is executable.

For example, at least two elastically deflectable regions are formed on the lower part, e.g., arranged on opposite sides of the lower part, on each of which a first detent lug is formed, e.g., for the formfitting connection. It is considered advantageous that the regions are elastically movable towards one another and the memory unit is thus insertable into corresponding recesses of the wall part and the first printed circuit board.

According to example embodiments, a second printed circuit board is arranged between the wall part and the cover part. For example, the second printed circuit board is arranged parallel to the first printed circuit board and/or spaced apart from the first printed circuit board. It is considered advantageous that further signal electronics can be provided. In addition, the second printed circuit board is arrangeable between the wall part and the first printed circuit board.

According to example embodiments, at least one pin region is formed on the lower part, which is plugged into a recess in the first printed circuit board, e.g., for guiding the memory unit during the plug connection of the further printed circuit board, e.g., of conductor tracks functioning as contacts of the further printed circuit board to the first printed circuit board, e.g., to a plug connector part mounted on the first printed circuit board. It is considered advantageous that tilting can be avoided during the plug connection of the further printed circuit board to the first printed circuit board.

According to example embodiments, the first printed circuit board is equipped with a plug connector part, e.g., a socket strip, and the further printed circuit board of the memory unit is plug connected to the plug connector part. For example, the conductor tracks arranged on the further printed circuit boards function as contacts which are electrically detachably connected to contacts of the plug connector part. It is considered advantageous that simple production is provided.

According to example embodiments, the elastically deflectable regions have a corrugated, knurled, and/or roughened region on their side facing away from the further printed circuit boards, e.g., to enhance the grip. It is considered advantageous that secure and simple handling during the production is provided.

According to example embodiments, the detent lug abuts the side of the wall part facing toward the first printed circuit board. It is considered advantageous that the memory unit is insertable through a recess in the wall part while it is being guided by the pin regions on the first printed circuit board, and can be delimited in a formfitting manner on the wall part after the plug connection has been made between the further and the first printed circuit board.

According to example embodiments, a detent lug formed, e.g., molded on the lower part and/or the upper part abuts the side of the wall part facing away from the first printed circuit boards. It is considered advantageous that the wall part is connected in a formfitting manner to the memory unit.

According to example embodiments, the further printed circuit board has depressions, e.g., notches, into which elastically deformable detent lugs formed, e.g., molded, on the upper part and/or lower part protrude. It is considered advantageous that the memory unit is held in a form-fitting manner on the further printed circuit board.

According to example embodiments, the detent lug formed on the lower part and/or upper part has a bevel which, with increasing distance from the pin region or regions, has a decreasing distance to the further printed circuit board. It is considered advantageous that the memory unit is fastenable on the wall part in a form-fitting manner.

According to example embodiments, the respective detent lug formed on the elastically deflectable region has an insertion bevel, which has an increasing distance to the further printed circuit board with increasing distance from the pin region or regions. It is considered advantageous that a delimitation is achievable on the wall part.

According to example embodiments, the further printed circuit board is equipped with the switch unit and a data memory that is particularly stable over the long term. It is considered advantageous that the parameters of an electrical device can be passed on to another electrical device in a simple manner.

According to example embodiments, a centering bolt is formed on the lower part and/or upper part, which is spaced apart from the pin region or regions and protrudes into a further, e.g., continuous, recess of the first printed circuit board.

It is considered advantageous that improved centering of the memory unit is provided.

According to example embodiments, the upper part is connected to the lower part in a formfitting manner, e.g., by a clip connection. It is considered advantageous that a simple but secure connection is implementable.

According to example embodiments, the wall part has recesses through which input elements, e.g., potentiometers, rotary switches, or further DIP switches, are operable using a tool. It is considered advantageous that, on the one hand, the wall part functions as an insulating device and, on the other hand, the operation of the input device through the wall part is still provided.

According to example embodiments, at least one potentiometer is arranged on the first printed circuit board and the cover part has a recess covered using a closure part, e.g., a closure screw, and the potentiometer is actuatable by a screwdriver protruding through the recess when the closure screw is removed. It is considered advantageous that the potentiometer can be arranged in a sealed spatial region and is accessible for operation by loosening, i.e., unscrewing, the closure screw.

Further features and aspects of example embodiments of the present invention are explained in more detail below with reference to the appended schematic Figures.

DETAILED DESCRIPTION

Figure 1:
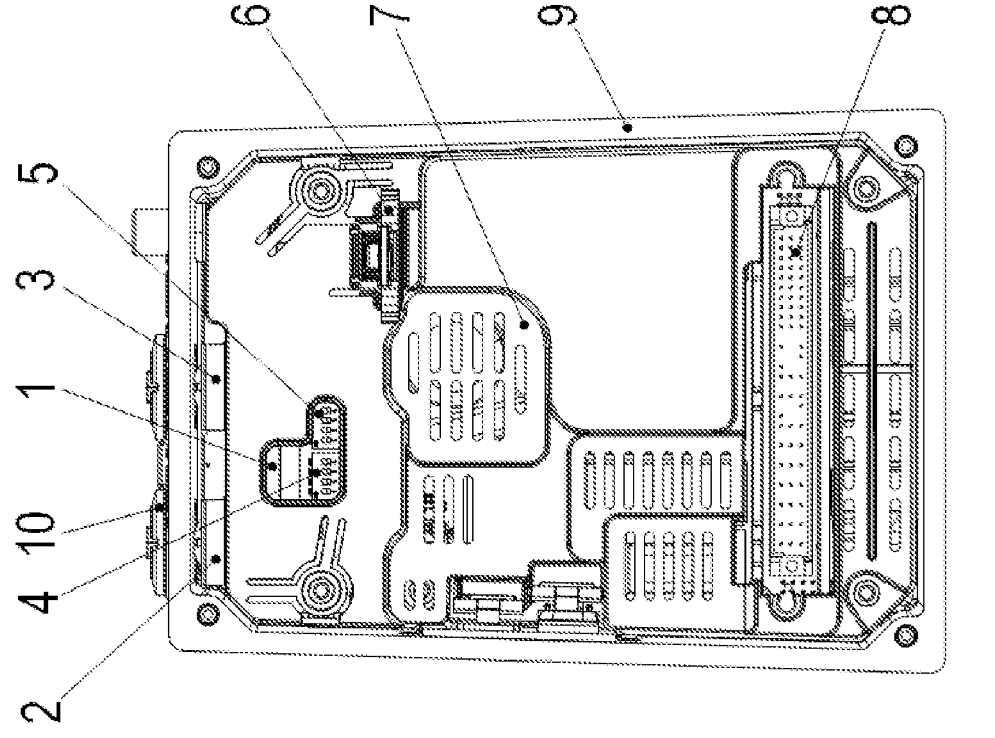
FIG. 1 is a top view of a cover part 9 of a converter motor according to an example embodiment of the present invention.
Figure 2:
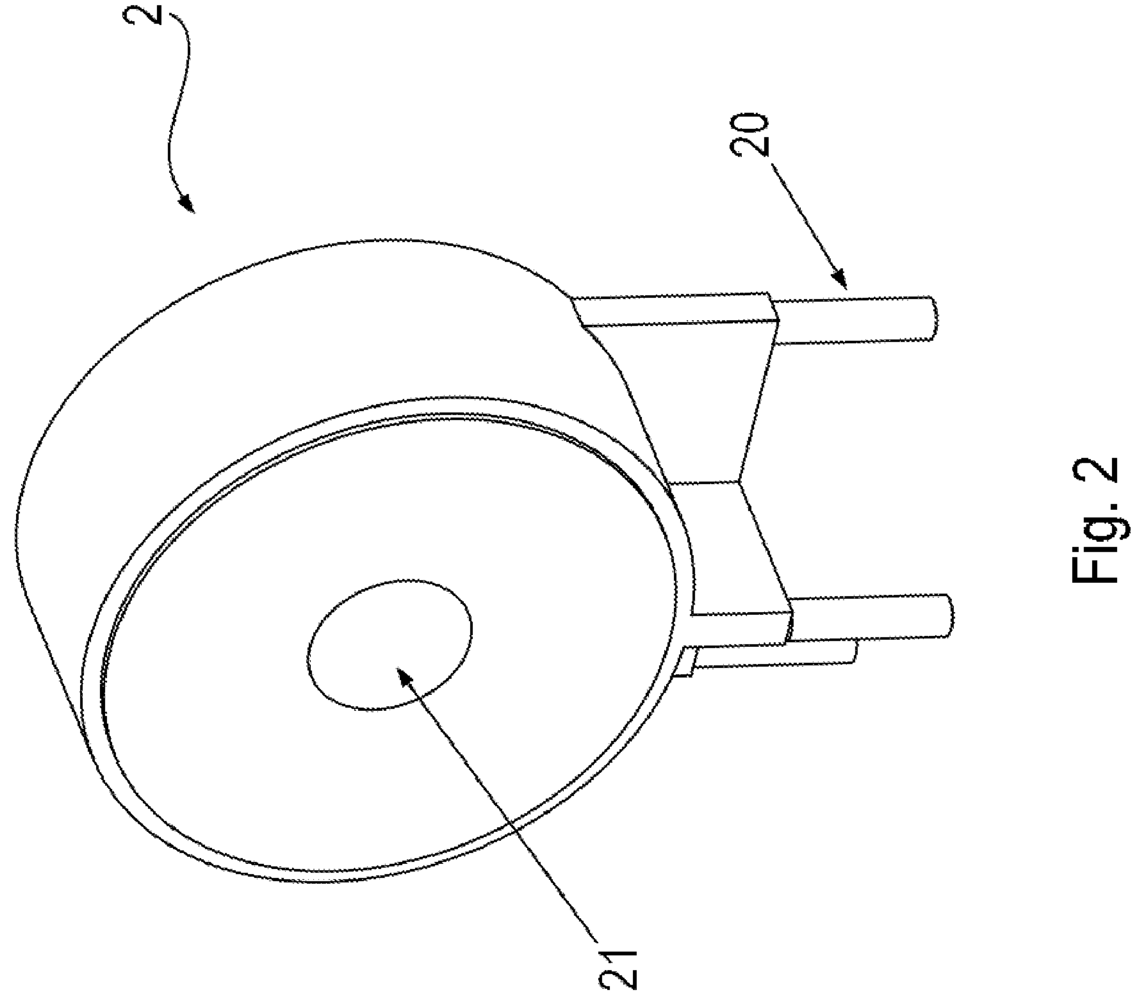
FIG. 2 is a perspective view of a potentiometer 2, which is accommodated in the cover part 9 and is mountable in the first printed circuit board 70.
Figure 3:
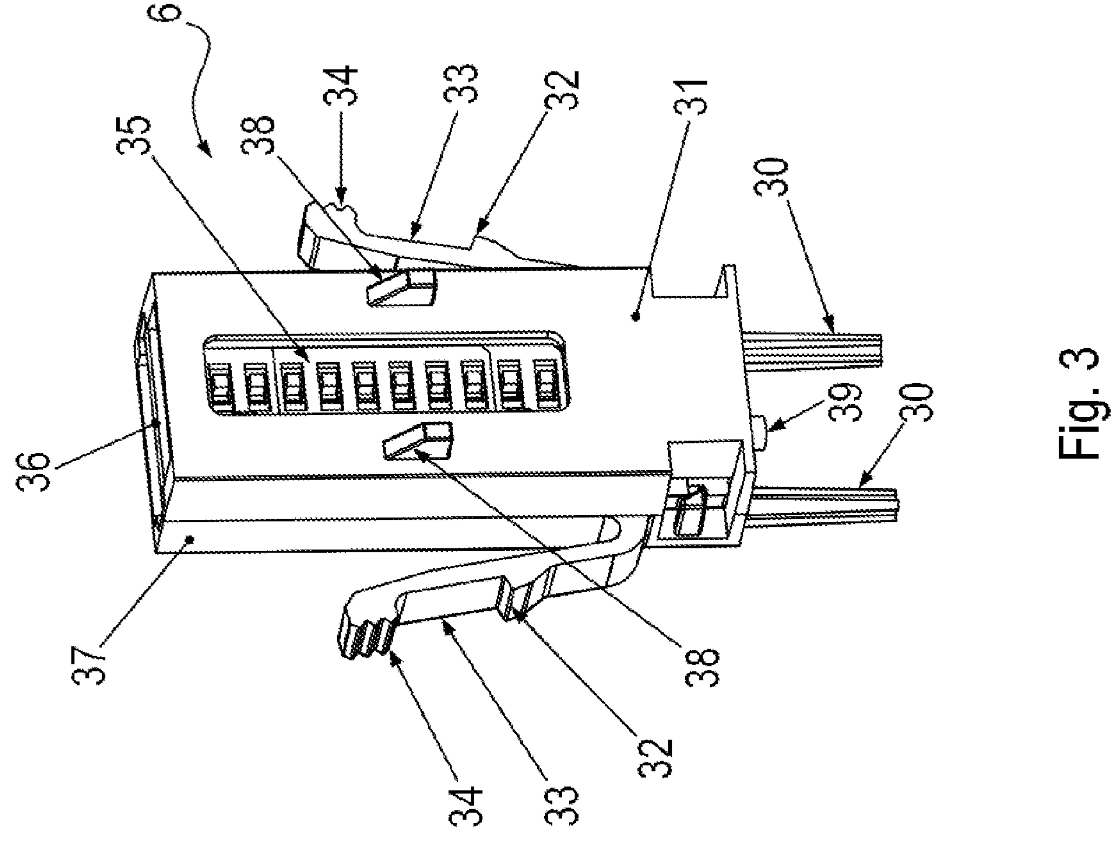
FIG. 3 is a perspective view of a memory unit 6 plugged into the first printed circuit board 70.
Figure 4:
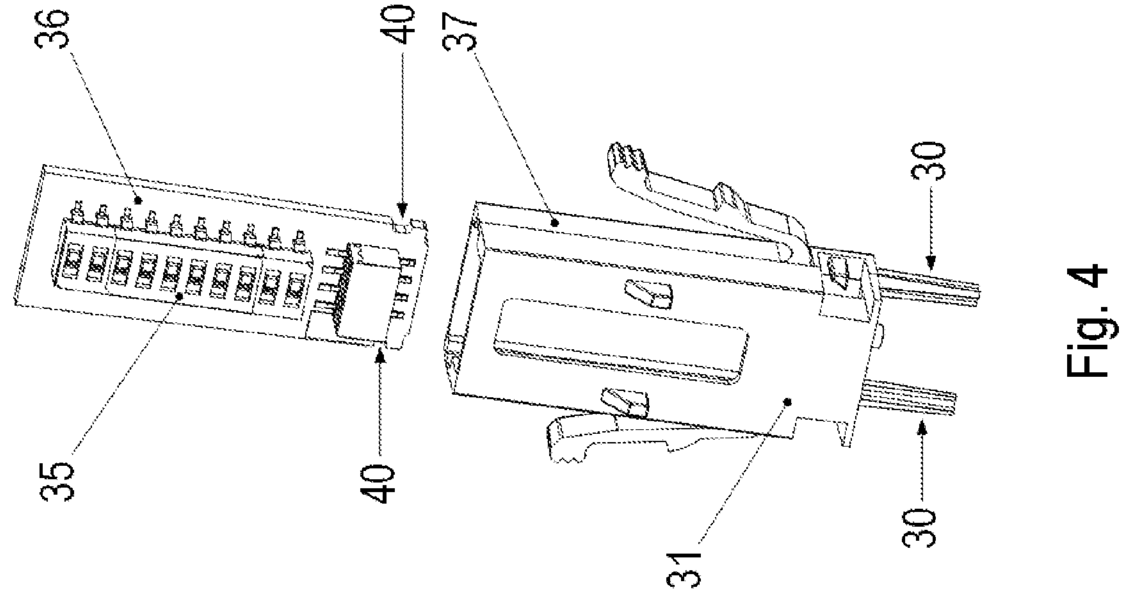
FIG. 4 is a partial exploded perspective view of the memory unit 6.
Figure 5:
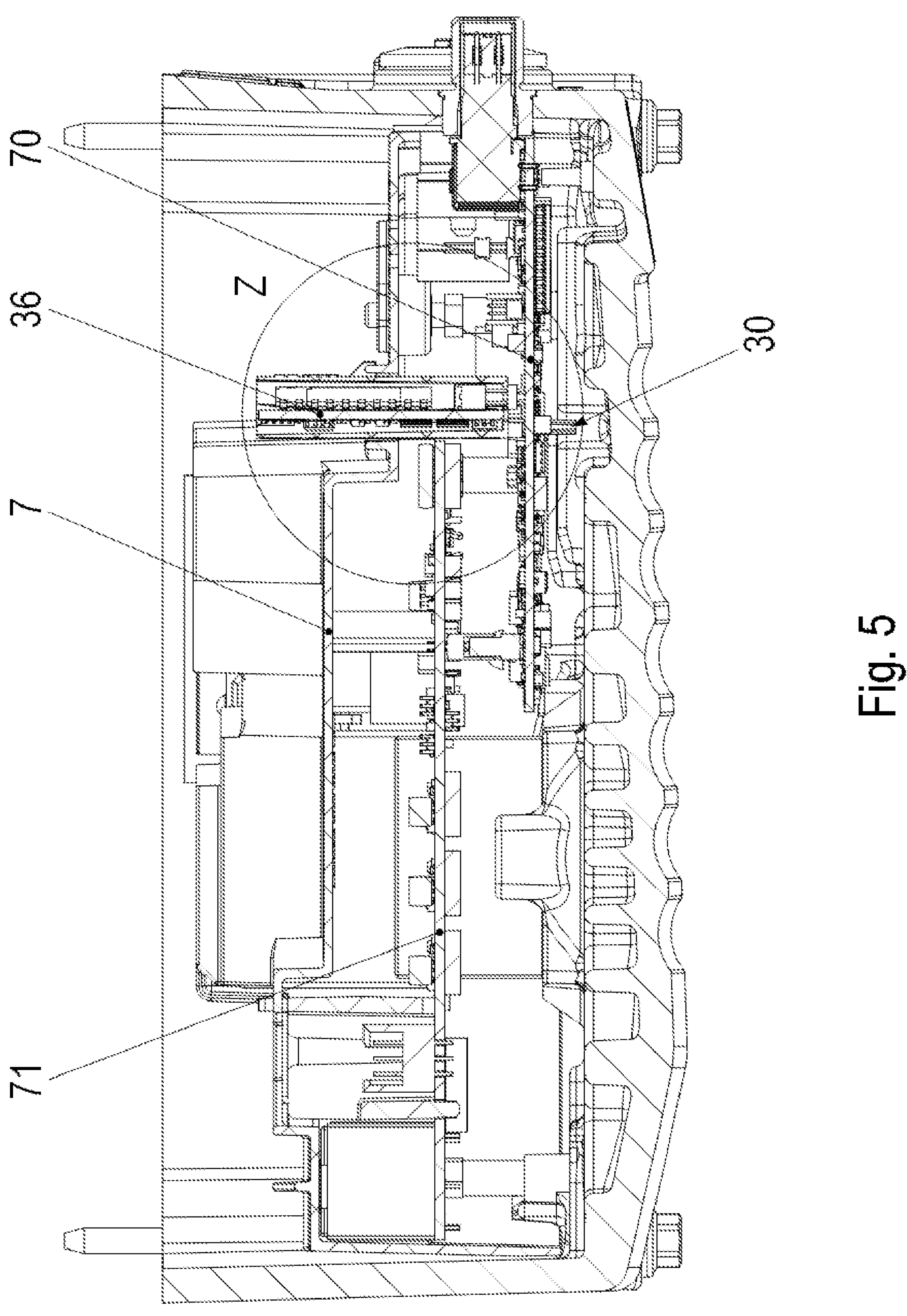
FIG. 5 is a cross-sectional view of the latching of the memory unit 6 on a wall part 7 arranged as an insulation device.
Figure 6:
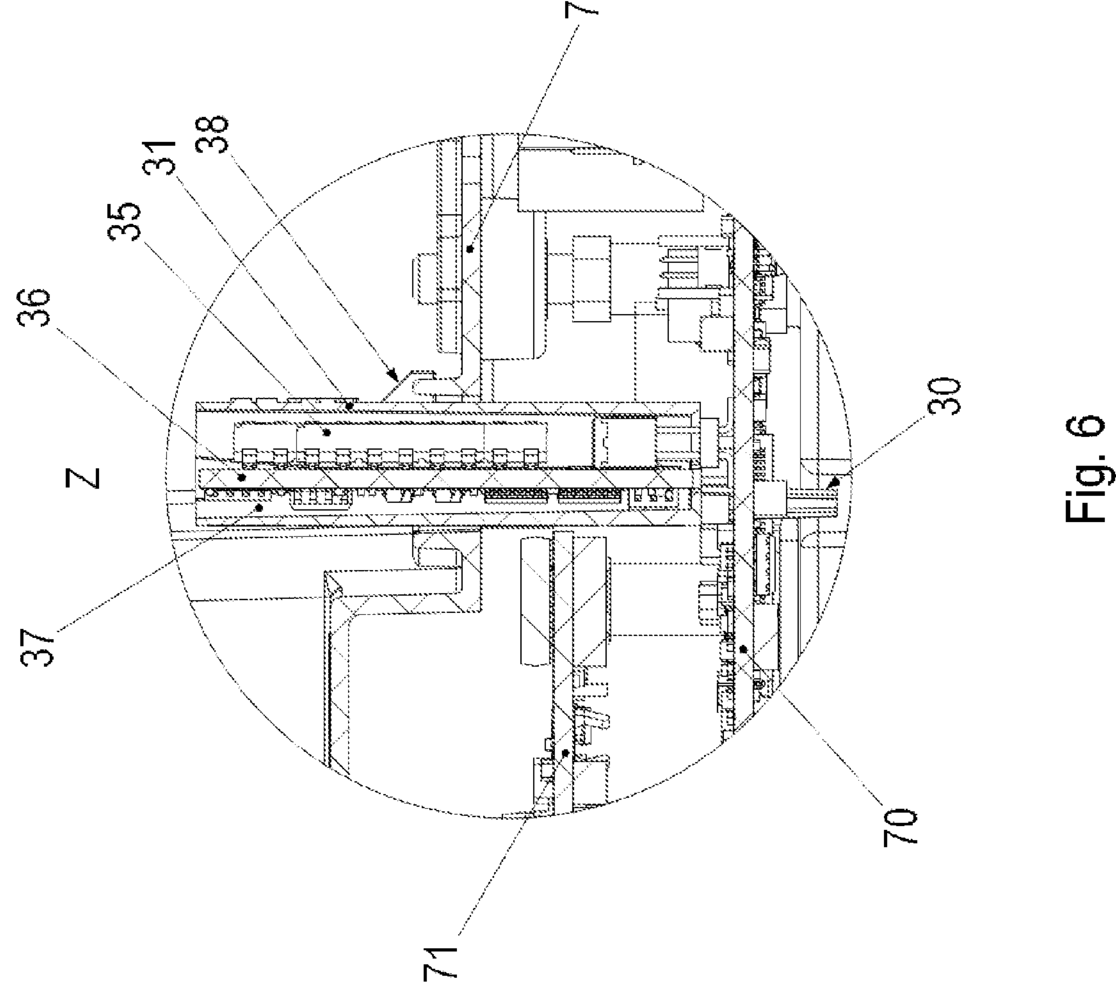
FIG. 6 is an enlarged view of a portion of FIG. 5.

As schematically illustrated in the Figures, the cover part 9 has a pot-like configuration, so that a first printed circuit board 70 is accommodated therein and is pressed onto the cover part 9 by screws which are screwed into threaded holes of the cover part 9.

The cover part 9 is, for example, made of metal, e.g., die-cast aluminum.

A wall part 7, e.g., made of plastic, is also fastened on the cover part 9 and substantially covers the printed circuit board 70 so that the printed circuit board 70 is arranged in the spatial region bordered by the wall part 7 and the cover part 9.

The printed circuit board 70 is equipped with electronic components and a rotary switch 1, which is accessible and/or operable, e.g., rotatable, through a recess in the wall part 7. However, the cover part 9 is first to be detached from a lower part which is fastened on a motor housing or is formed integrally with it.

In addition, the printed circuit board 70 is equipped with a first and second potentiometer (2, 3), which are arranged on the printed circuit board 70 such that actuation of the respective potentiometer (2, 3) is provided when a closure screw 10 is removed, which is arranged in a recess of the cover part 9. A tool, for example a screwdriver, can be guided from the external surroundings through the recess in the cover part 9 to the potentiometer (2, 3) and the potentiometer (2, 3) is actuatable.

The memory unit 6 has a lower part 37 having pin regions 30 integrally formed, e.g., in one piece, on the lower part 37 and in particular spaced apart from one another, and an upper part 31.

Upper part 31 and lower part 37 are, for example, manufactured from plastic.

Through the recess in the wall part 7, DIP switches mounted on the printed circuit board 70 (4, 5) are also actuatable.

A further printed circuit board 36 is arranged in the memory unit 6 and is equipped at least with a long-term stable data memory and a DIP switch 35.

Parameters for starting up the converter are the storable in the memory unit 6 and a quick start-up is executable.

The memory unit 6 has a lower part 37 and an upper part 31 which are connected to one another, e.g., clip-connected.

Pin regions 30 are formed on the lower part 37 so that a guided connection of the memory unit 6 is provided. The guiding takes place during the production, e.g., when the memory unit 6 is plugged into the first printed circuit board 70 by plugging the pin regions 30 into corresponding recesses of the first printed circuit board 70.

The printed circuit board 36 has notches arranged opposite to one another on two sides, into which lug regions, which are formed on the lower part and are elastically deflectable toward the printed circuit board 36, snap in. The printed circuit board 36 is thus accommodated in the memory unit 6 in a form-fitting manner.

Elastically deflectable regions 33 are formed on two opposite sides on the lower part 37 and have a detent lug 32 and a corrugated region 34. The elastically deflectable regions 33 are movable towards one another with one hand and can be elastically pretensioned at the same time. The corrugated regions 34 prevent the fingers of this hand from slipping. During the elastic deflection of the regions 33, the memory unit 6 is guided for insertion into the cover part 9 in the direction of the longest extension of the pin regions 30 using the pin regions 30 through a recess in the wall part 7 and through at least two recesses in the first printed circuit board 70. In this manner, centering towards the first printed circuit board 70 is executable, so that conductor tracks formed as contacts on the further printed circuit board 36 of the memory unit 6 are insertable into a plug connector part, e.g., a socket part, mounted on the printed circuit board 70, e.g., without tilting. The plug connection of the further printed circuit board 36 to the first printed circuit board 70 is thus executable without tilting because of the guiding by the pin regions 30 arranged leading. First, when the memory unit 6 is inserted, the pin regions 30 penetrate the recesses in the first printed circuit board 70 and only then is the electrical plug connection effectuated.

The printed circuit board 36 is thus aligned perpendicularly to the first printed circuit board 70 and to the second printed circuit board 71 arranged in parallel to the first printed circuit board 70 and to the region of the wall part 7 surrounding the memory unit 6.

A simple connection is executable by the electrical plug connection between the first printed circuit board 70 and the further printed circuit board 36 of the memory unit 6. For this purpose, the form-fitting connection of the further printed circuit board 36 in and with the lower part 37 of the memory unit 6 and its form-fitting play-free connection, e.g., clip connection, by the elastically deflectable regions 33 to the wall part 7 secures the memory unit 6. The two pin regions formed on the lower part 37 center the memory unit 6 on the first printed circuit board 70.

A centering bolt 39 additionally formed on the lower part 37 is formed on the lower part 37 and protrudes into a correspondingly shaped further recess of the first printed circuit board 70. Thus, centering of the memory unit 6 is readily executable.

On the upper part 31 of the memory unit 6, further detent lugs 38 are formed, which are latched on the wall part 7, which has corresponding projection regions suitably shaped to form a latching connection with the detent lugs 38. The detent lugs 38 have insertion bevels, the bevel of which is opposite to the bevels formed on the detent lugs 32 of the elastic regions 33, however.

Thus, when the memory unit 6 is inserted, the elastic regions 33 are elastically compressed towards the lower part 37 and the detent lugs 32 pass through the recess arranged on the wall part 7. After relaxing the elastically deflectable regions 33, the detent lugs 32 abut the lower side, i.e., the side facing toward the first printed circuit board 70, of the wall part 7, so that the memory unit 6 is blocked from retraction. In addition, the detent lugs 38 abut the other side, thus, e.g., the upper side, of the wall part 7. The wall part 7 is thus delimited between the detent lugs 38 formed on the lower part 37 and the detent lugs formed on the upper part 31. In other words, the memory unit 6 is held in a form-fitting manner on the wall part 7.

The connecting line of the two detent lugs 38 is aligned perpendicularly to the connecting line of the two detent lugs 32 since the detent lugs 38 and 32 are arranged on different sides of the memory unit 6.

A DIP switch 35 is mounted on the printed circuit board 36 of the memory unit 6 and can be used to effectuate different parameterizations which determine the type of operation, e.g., the operating mode, of the signal electronics mounted on the printed circuit boards 70 and 71. The signal electronics thus function as a different AS-Interface slave type depending on the switch position of the DIP switches 35 and/or work with a different AS-Interface slave profile depending on the switch position of the DIP switches 35. Depending on the switch positions of the DIP switch 35, a respective different operating mode of the signal electronics accommodated in the cover part 9 is activated when the memory unit 6 is plugged in.

It is considered advantageous that no separate electrical devices, e.g., converters, have to be provided for the implementation of different AS-Interface slave profiles or types, and that the cover part 9 having the electrical device having signal electronics accommodated therein is usable for various profiles and types. For this purpose only the DIP switch 35 has to be provided and the switch position of the DIP switch 35 is used to set the respective desired AS-Interface slave profile or type.

A very quick and ready replacement is thus made possible in the event of a repair, in that the signal electronics together with the memory unit 6 are replaced and the DIP switch position is adopted.

The at least two notches 40 are arranged on the printed circuit board 36 on two opposite edges of the printed circuit board 36.

The cover part 9 is, for example, made of plastic. Alternatively, however, a configuration made of die-cast aluminum is also possible.

The wall part 7 is, for example, made of a highly insulating plastic and is therefore also capable of functioning as a thermal barrier.

For example, an electrical device is arranged as a converter motor, and the signal electronics are arranged in a cover part 9, into which a memory module arranged as a memory unit 9 is pluggable by a detent connection or clip connection, and a latching connection or clip connection is provided with the wall part 7 that is connected to the cover part 9 by screws or a detent connection, e.g., similar to the first printed circuit board 70.

In further exemplary embodiments, the cover part is placed on a lower part and tightly connected, and the lower part is arranged on a housing part of an electric motor and tightly connected. A compact configuration of the electrical device as a converter motor is thus implementable.

LIST OF REFERENCE NUMERALS

- 1 rotary switch
- 2 potentiometer
- 3 potentiometer
- 4 DIP switch
- 5 DIP switch
- 6 memory unit
- 7 wall part, e.g., thermal barrier
- 8 plug connector part
- 9 cover part
- 10 closure screw, e.g., made of plastic
- 20 leg 21 mechanical interface for formfitting engagement of a tool
30 pin region
31 upper part
32 detent lug
33 elastic region of the lower part 37
34 corrugated region
35 DIP switch
36 printed circuit board
37 lower part
38 detent lug
39 centering bolt
40 notch
70 first printed circuit board
71 first printed circuit board

The invention claimed is:

1. An electrical device, comprising:

a cover part; and signal electronics, including a first printed circuit board and a memory unit electrically plug connected to the first printed circuit board, the memory unit including a switch unit, the signal electronics having a selectable AS-Interface slave profile and/or AS-Interface slave type based on a switch position of the switch unit;

wherein the memory unit includes a further printed circuit board accommodated in a housing of the memory unit, the housing including a lower part and an upper part connected to the lower part; and wherein at least one pin region is formed on the lower part and is arranged in a recess in the first printed circuit board for leading guidance of the memory unit during plug connecting the further printed circuit board, conductor tracks arranged as contacts of the further printed circuit board to the first printed circuit board and/or to a plug connector part mounted on the first printed circuit board.

2. The electric device according to claim 1, wherein the electrical device is arranged as a converter and/or a converter motor, the switch unit includes a selector switch and/or a DIP switch, and a selectable operating mode of the signal electronics is based on the switch position of the switch unit.

3. The electric device according to claim 1, wherein a wall part is connected to the cover part, and the first printed circuit board is arranged between the wall part and the cover part.

4. The electric device according to claim 3, wherein the wall part is screw-connected and/or detent-connected to the cover part, and the first printed circuit board is connected to the cover part.

5. The electric device according to claim 3, wherein the wall part is made of plastic and/or the cover part is made of metal and/or a die-cast aluminum part.

6. The electric device according to claim 5, wherein the wall part is arranged as a heat barrier.

7. The electric device according to claim 5, wherein the wall part is arranged as a heat barrier to a housing part of which the cover part is connected.

8. The electric device according to claim 1, wherein at least two elastically deflectable regions are arranged on the lower part and/or on opposite sides of the lower part, a first detent lug being formed on each elastically deflectable region.

9. The electric device according to claim 3, wherein a second printed circuit board is arranged between the wall part and the cover part.

10. The electric device according to claim 9, wherein the second printed circuit board is arranged parallel to the first printed circuit board and/or spaced apart from the first printed circuit board.

11. The electric device according to claim 1, wherein the first printed circuit board includes a plug connector part, and the further printed circuit board of the memory unit is plug connected to the plug connector part.

12. The electric device according to claim 11, wherein the plug connector part includes a socket, and the further printed circuit board is electrically detachably connected to contacts of the plug connector part.

13. The electric device according to claim 8, wherein the elastically deflectable regions have a corrugated, knurled, and/or roughened region on a side facing away from a further printed circuit boards of the memory unit.

14. The electric device according to claim 8, wherein the detent lug abuts a side of a wall part, connected to the cover part, facing toward the first printed circuit board.

15. The electric device according to claim 1, wherein a detent lug formed and/or molded on the lower part and/or the upper part abuts a side of a wall part, connected to the cover part, facing away from the first printed circuit board.

16. The electric device according to claim 1, wherein the further printed circuit board includes depressions and/or notches, into which elastically deformable detent lugs formed and/or molded on the upper part and/or lower part protrude.

17. The electric device according to claim 1, wherein a detent lug formed on the lower part and/or upper part includes a bevel which, with increasing distance from the pin region, has a decreasing distance to the further printed circuit board.

18. The electric device according to claim 8, wherein a detent lug formed on the elastically deflectable region has an insertion bevel, which has an increasing distance to the further printed circuit board with increasing distance from a pin region formed on the lower part and/or the upper part.

19. The electric device according to claim 1, wherein: (a) the further printed circuit board includes the switch unit and a data memory; (b) a centering bolt is formed on the lower part and/or upper part, which is spaced apart from a pin region and protrudes into a further and/or continuous recess of the first printed circuit board; (c) the upper part is connected to the lower part in a form-fitting manner and/or by a clip connection; (d) a wall part, connected to the cover part, includes recesses through which input devices, potentiometers, rotary switches, and/or further DIP switches are operable using a tool, the first printed circuit board being arranged between the wall part and the cover part; and/or (e) at least one potentiometer is arranged on the first printed circuit board and the cover part has a recess covered by a closure part and/or a closure screw, the potentiometer being actuatable by a screwdriver protruding through the recess when the closure part and/or the closure screw is removed.

20. The electric device according to claim 1, wherein the upper part is connected to the lower part in a form-fitting manner by a clip connection.

21. An electrical device, comprising: a cover part; and signal electronics, including a first printed circuit board and a memory unit electrically plug connected to the first printed circuit board, the memory unit including a switch unit, the signal electronics having a selectable AS-Interface slave profile and/or AS-Interface slave type based on a switch position of the switch unit; wherein the memory unit includes a further printed circuit board accommodated in a housing of the memory unit, the housing including a lower part and an upper part connected to the lower part; and wherein the upper part is connected to the lower part in a form-fitting manner by a clip connection; when the memory unit is inserted, the clip connection abuts a side facing toward the first printed circuit board and blocks the memory unit from retraction.

* * * * *